(12) United States Patent
von Staudt et al.

(10) Patent No.: US 8,143,953 B2
(45) Date of Patent: Mar. 27, 2012

(54) SELF-TRIM AND SELF-TEST OF ON-CHIP VALUES

(75) Inventors: Hans Martin von Staudt, Abingdon (GB); Rolf Hülβ, Hockenheim (DE); Michael Keller, Heidelberg (DE); Helmut Burkhardt, Heidelberg (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 500 days.

(21) Appl. No.: 12/455,530

(22) Filed: Jun. 3, 2009

(65) Prior Publication Data

US 2010/0289590 A1 Nov. 18, 2010

(30) Foreign Application Priority Data

May 18, 2009 (EP) .................................... 09392001

(51) Int. Cl.
*H03L 7/085* (2006.01)
(52) U.S. Cl. ........................ 331/1 A; 331/25; 331/177 R
(58) Field of Classification Search .................. 331/1 A, 331/25, 111, 143, 177 R, 179; 714/724; 324/750.01; 365/189.09
See application file for complete search history.

(56) References Cited

U.S. PATENT DOCUMENTS

| | | | |
|---|---|---|---|
| 5,182,528 A * | 1/1993 | Zuta | 331/1 A |
| 5,319,370 A | 6/1994 | Signore et al. | |
| 5,550,512 A | 8/1996 | Fukahori | |
| 5,892,408 A * | 4/1999 | Binder | 331/44 |
| 6,111,471 A | 8/2000 | Bonneau et al. | |
| 6,114,920 A | 9/2000 | Moon et al. | |
| 6,124,764 A * | 9/2000 | Haartsen et al. | 331/111 |
| 6,433,714 B1 | 8/2002 | Clapp et al. | |
| 6,504,394 B2 | 1/2003 | Ohlhoff | |
| 6,909,642 B2 | 6/2005 | Lehmann et al. | |
| 6,943,616 B2 | 9/2005 | Ogawa et al. | |
| 7,284,167 B2 | 10/2007 | Lee et al. | |
| 7,352,230 B2 | 4/2008 | An | |
| 7,890,787 B2 * | 2/2011 | Bradley et al. | 713/500 |
| 2001/0004126 A1 | 6/2001 | Ohlhoff | |
| 2006/0274594 A1 | 12/2006 | Huckaby et al. | |
| 2006/0276986 A1 | 12/2006 | Anderson et al. | |
| 2007/0133319 A1 | 6/2007 | Noichi | |
| 2008/0012596 A1 | 1/2008 | Lewison et al. | |
| 2009/0278620 A1 * | 11/2009 | Taghivand et al. | 331/36 C |

FOREIGN PATENT DOCUMENTS

JP 2004179505 6/2004

OTHER PUBLICATIONS 09392001.5-2216, Oct. 9, 2009, Dialog Semiconductor GmbH, European Search Report.

* cited by examiner

*Primary Examiner* — Joseph Chang
*Assistant Examiner* — Jeffrey Shin
(74) *Attorney, Agent, or Firm* — Saile Ackerman LLC; Stephen B. Ackerman

(57) ABSTRACT

A self-trim circuit provides a technique to trim a CUT (circuit under trim) using a LSB offset to determine the best digital value to trim the CUT. The self-trim circuit is also used to self-test the digital and analog portions of the self-trim circuitry, whereby the existence of a digital stuck at fault condition is detected. A state machine controls a digital stack to couple digital trim data to the CUT and read the output of a comparator circuit that signifies when a proper digital trim value has been used. Thereafter the proper digital trim value is stored into a nonvolatile memory.

22 Claims, 3 Drawing Sheets

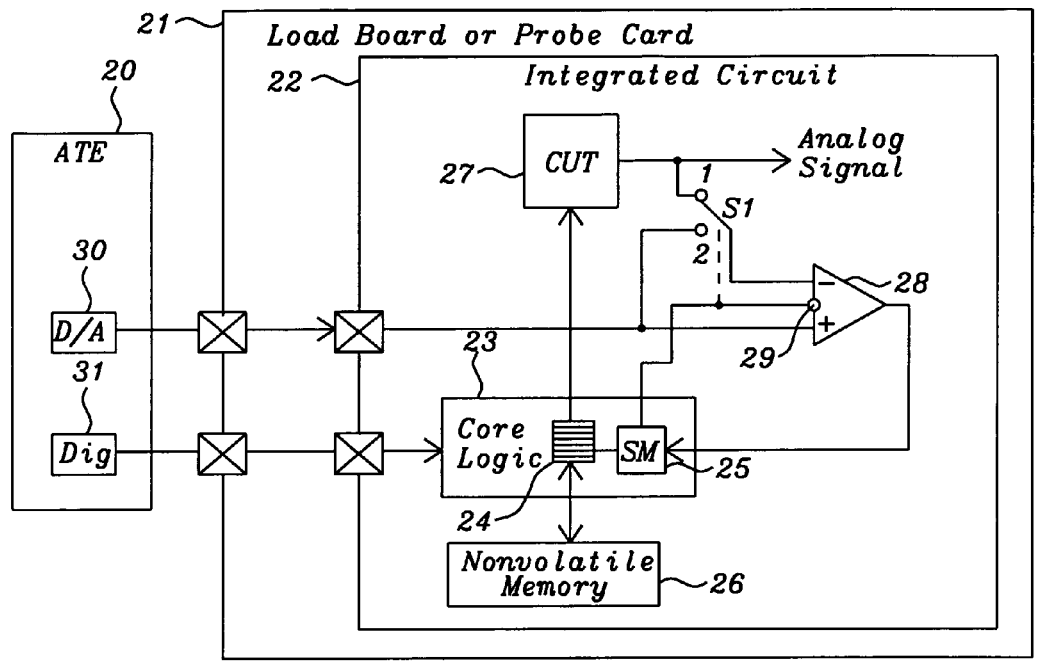
*FIG. 2A*
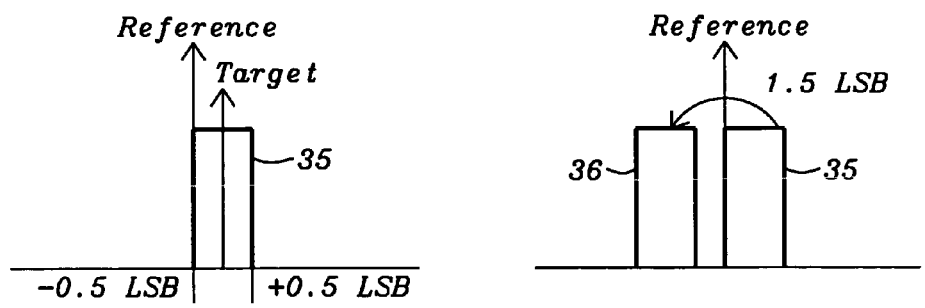
*FIG. 2B*  *FIG. 2C*

FIG. 3A –
Prior Art
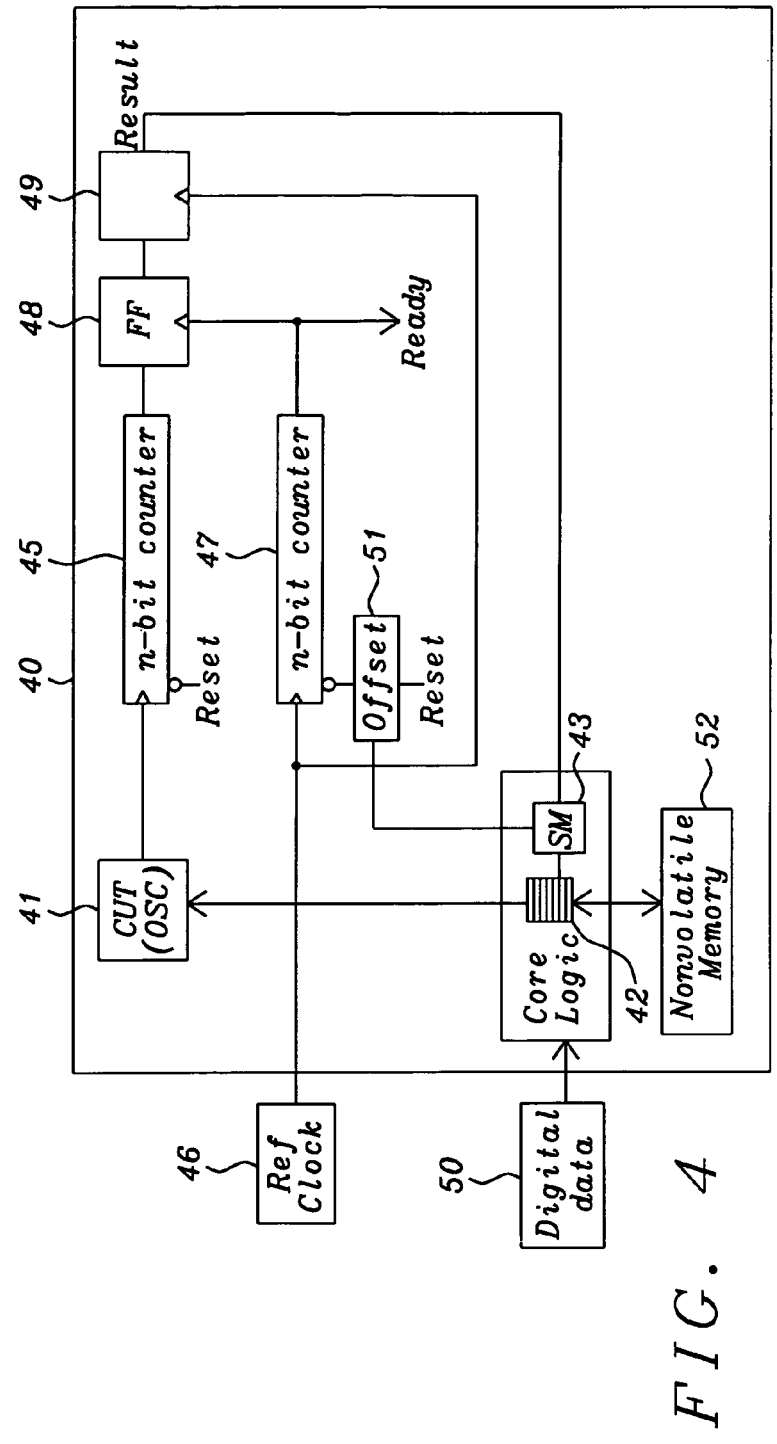
FIG. 3B
FIG. 4

SELF-TRIM AND SELF-TEST OF ON-CHIP VALUES

BACKGROUND OF THE INVENTION

1. Field of Invention

The present invention is related to calibration and testing of semiconductor chips and in particular to the self-trimming and self-testing of on-chip analog values.

2. Description of Related Art

Integrated circuits use a wide collection of analog circuitry to enable the function of the integrated circuits ranging from reference voltages to reference currents, offsets, comparator thresholds and oscillator frequencies. Imperfection in the manufacture of the chips containing the integrated circuits results in the need to trim the values produced by the analog circuitry to produce a chip that might not function properly as designed. When performing multi-site testing, for instance semiconductor chips on a wafer, trimming cannot be done in parallel because the ATE (automatic test equipment) must react to the individual behavior of circuits on the various chips, individually calculate trim values and then send these values to the individual circuits.

U.S. Pat. No. 7,352,230 B2 (An) is directed to an internal power voltage trimming circuit and a method for individually or simultaneously performing level trimming for a plurality of power voltages in a semiconductor memory device. U.S. Pat. No. 7,284,167 (Le et al.) is directed to a method for providing programmable test conditions used in a BIST for a flash memory device. In U.S. Pat. No. 6,943,616 B2 (Ogawa et al.) an integrated circuit device and method is directed to adjusting an analog signal output without outputting the analog signal outside the integrated circuit device. U.S. Pat. No. 6,909,642 B2 (Lehmann et al.) is directed to integrated circuit chips having self-adjusting internal voltages and the method thereof. In U.S. Pat. No. 6,504,394 B2 (Ohlhoff) a circuit is directed to a configuration for trimming reference voltages within integrated circuit chips. U.S. Pat. No. 6,433,714 (Clapp et al.) is directed to methods and apparatus for trimming semiconductor devices and circuits. In U.S. Pat. No. 6,114,920 (Moon et al.) an auto-trim is directed to trimming a PLL oscillator operating curve for use during normal operations, wherein a state machine applies a digital control to a VCO during the auto-trim that is to be used in normal operations. U.S. Pat. No. 6,111,471 (Bonneau et al.) is directed to an apparatus for setting the free-running frequency of a VCO to a reference frequency and comprises setting the VCO within a frequency range and between frequency ranges. In U.S. Pat. No. 5,550,512 (Fukahori) a method is directed to providing a DC offset trim for automatic gain control independent of temperature and gain using a trim current connected to an AGC circuit. U.S. Pat. No. 5,319,370 (Signore et al.) is directed to a method and apparatus for calibrating errors in an analog reference voltage input to an ADC using a delta-sigma A/D converter.

In FIG. 1A is shown a block diagram of prior art for trimming a circuit under trim (CUT) 11 on an integrated circuit chip 10. The purpose of trimming is to overcome chip process variations in order to provide a more accurate analog signal and improve chip yield. The trimming operation is performed using automatic test equipment (ATE) to deliver digital trim data to the chip and monitor the analog trim values created by a CUT, which results from the digital trim data. As shown in FIG. 1A, an ATE 12 connects digital trim data to core logic 13 on the integrated circuit chip 10 where it is stored in a register 14. The core logic 13 connects the digital trim data to the CUT 11, which produces an analog signal. The analog signal is connected back to the ATE through an analog multiplexer 14. The ATE measures the untrimmed value of the analog signal and calculates a digital trim value that is connected to the core logic 13. The trim value is connected to the CUT where the process can be iterative depending upon the measured results of the trimmed analog signal output of the CUT. Once a trimmed value has been determined, the trim value is stored in a nonvolatile memory on the integrated circuit chip 10. The trim operation is performed in series with further testing of the integrated circuit and consumes valuable test time.

FIG. 1B shows how the natural distribution of a trimmed output of the CUT might be not centered where the target trim value is off center in on direction or another depending upon the algorithm used in trimming the CUT. FIG. 1C shows an ideal block distribution where the target value is centered within a $+\frac{1}{2}$ and a $-\frac{1}{2}$ least significant bit (LSB).

SUMMARY OF THE INVENTION

It is an objective of the present invention to provide a self-trim capability, which produces a trimmed circuit under trim (CUT) where the trimming process is independent of the ATE and allows testing not related to the CUT to proceed in parallel with the trimming process.

It is also an objective of the present invention to provide self-test of the a comparator circuit used in measuring the trim value as well as stuck-at faults in the digital signals connected to the CUT.

It is further an objective of the present invention to use an LSB offset to produce a trim value that is within an LSB of an analog reference.

It is still further an objective of the present invention to use the capability to provide an LSB offset to self-test a comparator circuit used to detect when a CUT has been trimmed.

In the present invention circuitry contained on an integrated circuit chip is used to both perform a self-test and self trim of a CUT freeing the ATE to perform tests on the integrated circuit chip on functions not related to the CUT and the trimming of the CUT while the self-test and self-trim operations are being carried out. The self-trim operation is set up by the ATE and is then carried out by a state machine contained within the integrated circuit chip. An LSB offset controlled by the state machine is used to determine the final setting of the CUT. After the trim value is determined, the value is stored in a nonvolatile memory. The successful completion of trim operations of a CUT provides a test for stuck at fault of the associated circuitry.

BRIEF DESCRIPTION OF THE DRAWINGS

This invention will be described with reference to the accompanying drawings, wherein:

FIG. 1A shows a block diagram of prior art for trimming a CUT under the control of an ATE;

FIG. 1B shows a natural distribution of trim values obtained by prior art trimming operations;

FIG. 2A is a block diagram of a digital self-trim configuration of the present invention;

FIG. 2B is a distribution of a self-trim operation by the present invention;

FIG. 2C is a distribution of a self-test operation of the present invention;

FIG. 3A is a test time line of prior art where trim operations test operations are controlled to be serial;

FIG. 3B is a test time line for the present invention where trim operations are performed in parallel with a portion of test on an integrated circuit chip; and FIG. 4 is a block diagram of the present invention of a self-trim of an oscillator clock frequency.

DETAILED DESCRIPTION OF THE PREFERRED EMBODIMENT

Figure 1C:
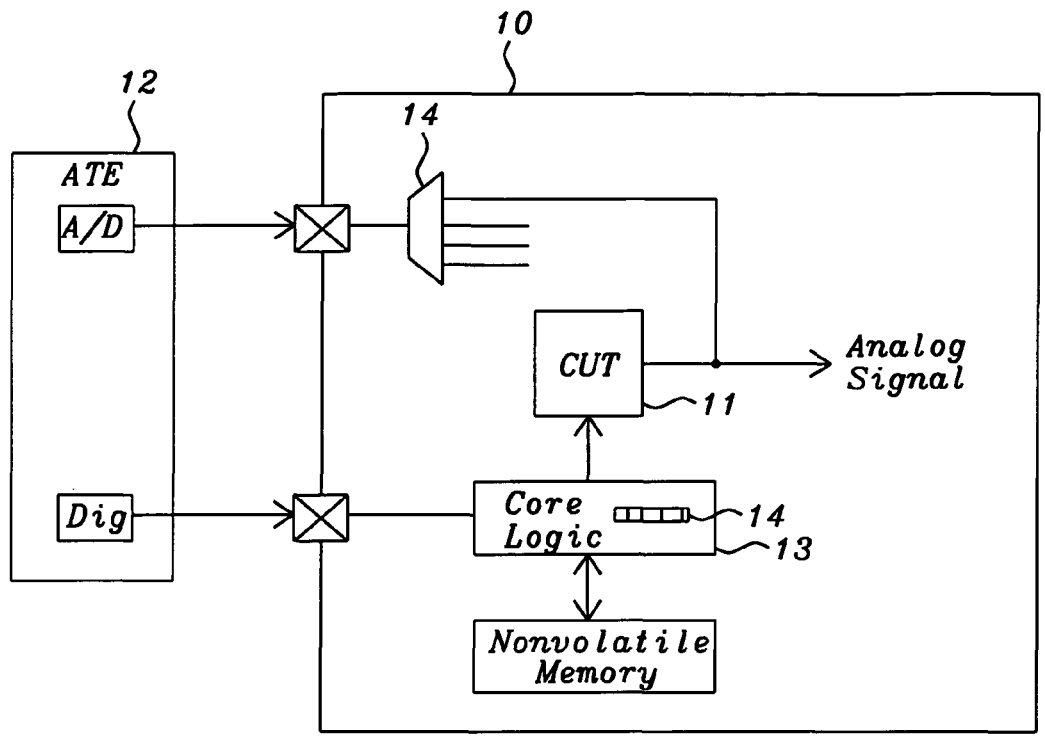
FIG. 1C show an ideal block distribution of trim values center about plus and minus ½ LSB.
Figure 1C:
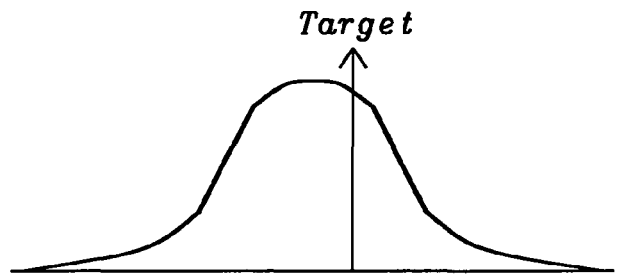
Figure 1C:
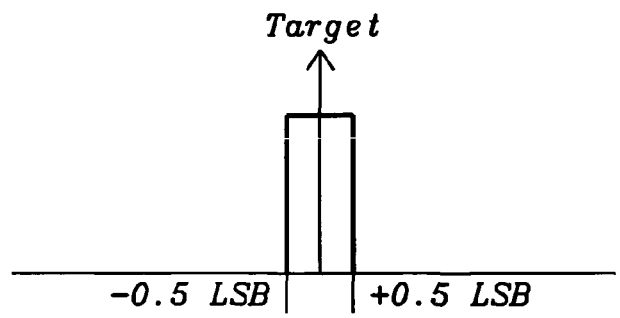

In FIG. 2A is shown a block diagram of the digital self-test and self-trim circuitry of the present invention. An ATE 20 is connected to a load board or probe card 21 which is connected to an integrated circuit under test 22. The ATE connects an analog reference signal to the integrated circuit chip from a D/A converter circuit 30, and a digital signal connected to core logic 23 through a Dig driver 31. The D/A converter 30 in the ATE 20 couples an analog reference signal to a comparator 28 within the integrated circuit 22 under trim and test. The core logic comprises a register stack 24 for holding digital data from the ATE and a state machine (SM) 25 for controlling self-test and self-trim operations. A nonvolatile memory 26 is connected to the register stack to store a final trim value to be used to control the analog output of the circuit under trim (CUT) 27 once trimming of the CUT has been completed. A comparator circuit 28 comprises an offset input 29 controlled by the state machine 25 that is used in both the self-test and self-trim operations to determine the proper trim value to store in the non-volatile memory 26.

To self-test the comparator 28, the state machine 25 controls switch S1 to position "2", which allows the reference 30 to be connected to both the plus and minus input of the comparator 28. Alternatively both inputs can be connected to the output of the CUT. Then the state machine 25 measures the output of the comparator. Without any offset control, the output of the comparator will be either a logical "0" state or a logical "1" state depending on semiconductor process differences in the input circuitry. The state machine then couples an offset 29 with first a positive and then a negative polarity to cause the output of the comparator 28 to switch to an expected state. If the output of the comparator changes state from a plus to a minus value or from a minus to a positive value, the operation of the comparator circuit is verified. The amount of offset should be high enough to allow some intrinsic offset of the comparator caused by the semiconductor process but small enough to produce a sensible test result, for instance. an offset window equivalent of +/−0.5 LSB of the CUT. Another sensible option would be −0.5/+1.0 LSB as a window of 1.5 LSB is beneficial for the self-test of the trim result (as described later).

It should be noted that it is within the scope of this invention that the analog signal output of the CUT 27 can be either a voltage or a current, wherein the comparator is configured accordingly to compare the analog output of the CUT 27 to a voltage or a current, respectively.

Consider FIG. 2B before continuing with self trim operations. In FIG. 2B is shown an ideal representation of the trimming of the CUT 27 to a reference value where the target value is centered in the block distribution. Because of limited digital resolution, any final digital trim will result in a block distribution 35 that is distributed around a mean digital distribution value (called target) by +0.5 and −0.5 of the LSB. This distribution results from variations in the process that produced the various integrated circuit chips located on the same wafer, same batch of wafers and between batches of wafer. The variation can also be produced from minor defects that do not prevent the particular circuitry from operating properly if an adjustment (trim) is performed.

A self-trim algorithm based on a comparator output will produce a block distribution on one side of the reference; however this block distribution will not be symmetrical around the reference as shown in FIG. 1C. Depending upon the algorithm used, the block distribution will be one side 35 of the reference or the other. A linear search algorithm provides the easiest to understand with respect to the behavior of the search results. In a linear search the state machine 25 (FIG. 2A) increases the digital trim value until the output of the comparator 28 switches state (trips). When the comparator 28 trips, the search algorithm stops, but the digital trimmed value 35 is now beyond the reference. The search algorithm could decide to choose the digital trim value before the trip point, but the distribution would again be on one side of the reference. If the search were done from the other side of the trim range, the result would again be found at one side or the other of the reference. Thus the only choice is to choose which side of the reference is preferred. If the comparator is designed with an intentional default offset of 0.5 LSB (see self-test of comparator) this offset can be used to compensate the single-sided effect as just described. Alternatively the reference has to be chosen 0.5 LSB away from the target.

In order to verify if the analog trim value that tripped the comparator 28 is within the expected distance of 1.0 LSB from the reference, a further switchable offset 29 is activated that changes the output of the comparator back to the value before the trip occurred. This verification offset 29 needs to be greater than 1.0 LSB in order to allow circuitry that produces a result at the far extreme of the block distribution 35 from the reference. A suitable value of the verification offset 29 is 1.5 LSB. As shown in FIG. 2C it is able to prove that the entire distribution will trip the comparator when the verification offset is activated.

Shown in FIG. 2C is the effect of an LSB offset 36 where 1.5 LSB is used to guarantee that a trimmed value, which is at the opposite end of the block distribution from the reference, can switch the output state of the comparator circuit. Thus a reference that is 0.5 LSB beyond the target can be chosen as exemplified in FIG. 2B when an offset 29 (FIG. 2A) of 1.5 LSB is applied to the comparator 28 (FIG. 2A). Another approach is to superimpose a noise signal of approx. 1 LSB onto the reference connected to the "+" terminal of the comparator 28. The state machine then takes several comparator results to decide the trim value, wherein the number of "1" and "0" states of the output of the comparator is used to determine the final result, but this is a complex approach in attempting to overcome a limited resolution of the comparator 28 in the time domain.

Returning to FIG. 2A, once the Dig 31 has connected digital trim data to the core logic 23 and the analog reference signal has been connected from the D/A 30 to the positive input of the comparator 28, the trim operation of the CUT is set to run autonomously under the control of the state machine 25. It first controls the switch S1 to position "1", which connects the output of the CUT 27 to the comparator 28. The digital trim data is stored in the register stack 24 and under the control of the state machine 25 is connected to the CUT 27. The switch S1 set in the "1" position to connects the output of the CUT to the minus input of the comparator 28.

The state machine next controls a search for a digital trim value that allows the CUT to perform to specifications. The search can be a linear search as previously discussed, or other algorithms including successive approximation. In all cases the final trim value of the CUT produces a result similar to that discussed with FIG. 2B. After the algorithm has finished, the search is stopped by the state machine and an offset is introduced to the input of the comparator 29. The intent of the offset is to verify that the last search step was within the allowable tolerance of the trimmed CUT. If the output of the comparator returns to the state previous to the tripping of the comparator, then the digital trim data is stored into the nonvolatile memory to be used to set up the CUT in an operational environment. The choice of which digital trim data is to be stored, before or after the comparator is tripped is dependent upon the choices made for a particular semiconductor product. In either case the final digital trim setting will produce an output from the CUT that is be within the offset of the reference signal.

FIG. 3A shows a test time line (t) where trimming of circuitry internal to an integrated circuit chip (Trim) is serially performed with tests to the integrated circuit chip (Test), which are not involved with the trim operation. The trimming of circuitry such as discussed with the aforementioned CUT takes up valuable test time for the integrated circuit. If self-trim operations (Trim), including any self-test operations of the trim circuitry, are performed in parallel with test operations (Test) not involved with the self-trim operations as shown in FIG. 3B, a substantial reduction in total time to test and trim the integrated circuit chip is realized. The trim operation is started by the ATE and thereafter runs autonomously in parallel with testing by the ATE of circuitry not associated with the circuitry being trimmed. As can be observed from FIG. 3B the TRIM operation starts delayed from the start of the TEST operation performed by the ATE. This is to allow the ATE to set up the trim operation including connecting trim data to the circuitry performing the trim operation. When the trim operation is completed the ATE collects the trim results and logs the data resulting from the trim operation.

In FIG. 4 is shown a block diagram of the present invention for trimming a CUT contained on an integrated circuit chip 40 comprising an oscillator that runs a clock on an integrated circuit chip 40. A CUT 41 comprising an oscillator, which may be formed by a VCO (voltage controlled oscillator) or other means that can be controlled from digital data, is frequency trimmed by the connection of digital data from a register stack 42 under the control of a state machine 43. The output of the CUT 41 is connected to a first n-bit counter 45. An external reference clock 46, which may exist in a tester, is connected to a second n-bit counter 47. The output of the first n-bit counter 45 is connected to a first flip-flop circuit 48 that is clocked by the second n-bit counter 47.

The first flip-flop 48 is connected to a second flip-flop 49 that is clocked by the reference clock 46. A result formed by the output of the second flip-flop 49 is connected to the state machine 43. The state of the resulting output of the second flip-flop 49 depends on the frequency of the CUT oscillator compared to the reference oscillator 46 such that the result=0 if the CUT oscillator frequency is less than the reference frequency, and the result=1 if the cut oscillator frequency is greater than the reference frequency. Digital data 50 that contains trim data for trimming the frequency of the oscillator CUT 41 is connected from an ATE to the register stack 42 contained within core logic and the state machine of the integrated circuit chip 40.

At the beginning of a trim operation and each trim step thereafter, both the first and second n-bit counters 45, 47 are reset, which in turn opens the first flip flop 48 to receive a signal from the first counter 45. When the reference clock signal has expired at the end of the second n-bit counter 47, the first flip flop circuit is clocked off by the second n-bit counter, and a "Ready" signal is produced indicating that the result of the trim step can be evaluated before the state machine proceeds by connecting a new trim value to the CUT 41. If the frequency of the CUT 41 is less than the frequency of the reference clock 46, the result captured in the flip-flop 48 will be a logical "0". If the frequency of the CUT 41 is higher than the frequency of the reference clock 46, the result captured in the flip-flop 48 will be a logical "1". The result value is coupled to the state machine 43 through a second flip-flop 49 in order to let possible metastability of flip-flop 48 settle. Once the trim algorithm is finished the offset 51 is turned on and the first and second n-bit counters are reset allowing the CUT 41 signal that produced the final trim result (assume "1") to propagate through the first n-bit counter 45 and the reference clock signal to propagate through the second n-bit counter 47, wherein the reset of the second n-bit counter 47 is modified by the amount of the offset 51. Then if the result=0 captured in the flip-flop 48 when the reference clock reaches the end of the second n-bit counter 47 (reset with the offset), the CUT oscillator 41 is verified to be trimmed to within the offset 51. The offset difference is 1.5 LSB (−0.5 to 1.0 LSB) as previously discussed with respect to FIGS. 2A and 2B, and the final and verified trim value of the CUT is stored into the nonvolatile memory 52.

Both the first and the second n-bit counters are reset at the same time with the reset of second n-bit counter 47 comprising an offset 51 that is equivalent to −0.5 LSB trimming step size. The state machine 43 connects different digital values stored in the register 42 to the CUT oscillator 41. After the trim algorithm has finished the offset is switched to +1.0 LSB and the trim setting of the CUT that produced the change of state is compared to the reference clock without the offset being imposed. If the comparison of the trimmed CUT and the reference clock without the offset produces a change of state of the compare value back to a logical "1", then the trimming of the CUT 41 is confirmed and the digital trim value connected to the CUT oscillator causing the change of state in the results of the first flip-flop is stored in the nonvolatile memory as the oscillator frequency trim value.

It should be noted that although the discussion with respect to FIG. 4 is oriented towards the CUT 41 being an oscillator, it is within the scope of this invention that the trim circuit is used to adjust time t, for example a pulse width of a time related signal.

The following are exemplary algorithms in Verilog/C-like pseudo code that search for a trim value. The first one is a binary search trim of the oscillator CUT 41 shown in FIG. 4. The second one is a linear search algorithm. The binary search tends to be faster and adapts well to the binary coding of the trim value. It should be noted that the self-test of the comparator is omitted as the comparator is implemented with digital logic that is assumed to be tested according to digital scan test principles. The 1.5 LSB verification step is at the end of each algorithm and is done once, not after every modification of the trim value. It should also be noted that similar algorithms can be written to trim the CUT 27 shown in FIG. 2A.

An exemplary bitwise approximation is demonstrated starting with the most significant bit to set the trim bit.

```
osc_BIST = TRUE;        // triggered by register write access
osc_offset = 0x00;
osc_ok = TRUE;
osc_trim[4:0] = 0b10000;
for (i = 4 downto 0)    // successive approximation loop
{
    osc_trim[i] = 1;
    Wait 8 clock cycles;    // let trim settings settle
    Start comparator;
    while (!ready);    // wait until comparator done
```

```
        if (osc_f > ref_f) osc_trim[i] = 0;
    }
    Wait 8 clock cycles;     // let trim settings settle
    osc_offset = 0x08;       // 1.5 LSB
    Start comparator; while (!ready); // verification measurement
    if (osc_f < ref_f) osc_ok = FALSE;
    osc_BIST = FALSE;        // ready signal to ATE.
```

The second exemplary algorithm is a linear search of a comparator threshold. Again the comparator self-test can be omitted as the offset itself is the value to be trimmed. The linear search algorithm is applied, wherein the comparator has a built-in hysteresis.

```
    vset_BIST = TRUE;            // triggered by register write access
    vset_lsb_offset = 0;         // -0.5 LSB
    vset_ok = TRUE;
    vset_trim[2:0] = 0b000;
    Wait 8 clock cycles;         // let trim settings settle
    while (!comp_out && vset_trim < 0b111)   // linear search
    {
        vset_trim++;             // increment
        Wait 8 clock cycles;
    }
    if (!comp_out) vset_ok = FALSE;     // fail
    vset_lsb_offset = 1;         // +1.0 LSB
    if (comp_out) vset_ok = FALSE;      // verification failed
    vset_BIST = FALSE;           // ready signal to ATE.
```

While the invention has been particularly shown and described with reference to preferred embodiments thereof, it will be understood by those skilled in the art that various changes in form and details may be made without departing from the spirit and scope of the invention.

What is claimed is:

1. A self-trim circuit, comprising:
   a) a circuit under trim (CUT) producing an analog signal and trimmed by a digital self-trim circuit;
   b) a compare circuit to compare an output of the CUT to a reference signal;
   c) said digital self-trim circuit receives and stores digital trim data to trim the CUT used to produce said output comparable to the reference signal, and said digital self-trim circuit controls said CUT to produce said output to match the reference signal to within a least significant bit (LSB) of the digital trim data, after which said digital circuit creates an offset to the compare circuit to verify the CUT trimmed to a value of the reference signal within the LSB.

2. The circuit of claim 1, wherein the LSB has a block distribution of one LSB to account for semiconductor process variations and effects of minor defects.

3. The circuit of claim 1, wherein the offset is 1.5 least significant bits.

4. The circuit of claim 1, wherein the output of the CUT is a voltage.

5. The circuit of claim 1, wherein the output of the CUT is a current.

6. The circuit of claim 1, wherein the output of the CUT is time, further comprising;
   a) frequency, the reciprocal of time; and
   b) pulse width.

7. The circuit of claim 6, wherein the CUT is an oscillator in which frequency trimming of the CUT further comprises:
   a) a comparison of outputs of two n-bit counters determines a frequency trim of said CUT relative to a reference frequency, wherein a first of the two n-bit counters counts the frequency trim of the CUT and a second of the two n-bit counters counts the reference frequency, wherein the two n-bit counters are reset at the same time to start the two n-bit counters, whereby an output of the first of the two n-bit counters compared to an output of the second of the two n-bit counters; and
   b) an offset implemented in the reset of the second of the two n-bit counters after the frequency trim of the CUT reaches the end of the first counter before the reference frequency reaches the end of the second counter to verify the frequency trim within the offset.

8. The circuit of claim 1, wherein said CUT and said digital circuit is located on an integrated circuit chip, wherein said reference signal and said digital data is sourced from automatic test equipment and said trim of the CUT is performed in parallel with other tests performed on the integrated circuit chip by the test equipment.

9. The circuit of claim 1, wherein said digital self-trim circuit further comprises a self-test capability using said trim circuitry, further comprising:
   a) a test of said compare circuit, wherein both inputs of said compare circuit are connected to the reference signal or the CUT signal; and
   b) a switchable offset of a known value connected to the compare circuit by the digital self-trim circuit and wherein the digital self-trim circuit reads the expected response of the compare circuit for both a positive and a negative value offset.

10. A method of self-test and self-trim, comprising:
   a) self-testing a comparator circuit of self trim circuit contained within an integrated circuit device, wherein said self-testing further comprises:
      i) connecting a reference signal to both input of the comparator circuit;
      ii) applying first a positive, then a negative offset to the comparator circuit; and
      iii) reading an output of the comparator circuit with a state machine to detect change of state of the comparator circuit;
   b) self-trimming a circuit under trim (CUT) contained within said integrated circuit device, if the comparator circuit passes testing of step a), otherwise rejecting said integrated circuit device;
   c) loading a register stack with a plurality of digital trim values to trim the CUT to produce a specified output;
   d) coupling an output of the CUT to a first input of the comparator circuit and the reference signal to a second input of the comparator circuit;
   e) applying said digital trim values to the CUT, one after another, until output of said comparator circuit changes state; then
   f) applying a verification offset to the comparator circuit to again force output of said comparator circuit to change state and thereby verifying the self-trimming of the CUT is within the verification offset; and
   i) storing into a nonvolatile memory the digital trim value causing the state change in comparator circuit output.

11. The method of claim 10, wherein the verification offset is 1.5 least significant bits.

12. The circuit of claim 10, wherein the output of the CUT is voltage.

13. The circuit of claim 10, wherein the output of the CUT is a current.

14. The circuit of claim 10, wherein the output of the CUT is time, further comprising;
   a) frequency; and
   b) pulse width.

15. The method of claim 10, wherein said register stack is loaded from automatic test equipment.

16. The method of claim 10, wherein said self-trimming of the CUT is controlled by a state machine.

17. An oscillator self trim circuit, comprising:
   a) a means for creating a digital signal when an output of a frequency generating circuit reaches a predetermined number of cycles;
   b) a means for comparing a first said digital signal created for an oscillator circuit under trim (CUT) and a second said digital signal created for a reference clock;
   c) a means for digitally adjusting and thereby trimming the frequency of the CUT, thereby forming a digital trim value for the CUT;
   d) a means for offsetting the start condition of said circuitry creating said second digital signal to verify said CUT output frequency trimmed to within said offset; and
   e) a means for storing the digital trim value.

18. The self trim circuit of claim 17, wherein said means for creating a digital signal is an n-bit counter, wherein a first n-bit counter counts an output signal of the CUT and a second n-bit counter counts the output signal of reference clock.

19. The self trim circuit of claim 18, wherein said means for comparing the first digital signal and the second digital signal is a flip-flop circuit, wherein the second digital signal clocks the flip-flop to determine when the first digital signal arrives at the flip-flop before the second digital signal clocks the flip-flop.

20. The self trim circuit of claim 17, wherein the means for digitally adjusting the frequency of the CUT is controlled by core logic on the same semiconductor chip as the cut, wherein the core logic comprises a state machine, and a register stack, and communicates with the CUT with digital circuitry.

21. The self trim circuit of claim 17, wherein the means for offsetting the start condition of circuitry the second digital signal produces an offset delay in the reset of the second n-bit counter greater than an equivalent of the least significant bit (LSB) of the digital trim value.

22. The self trim circuit of claim 17, wherein the means for storing the digital trim value comprises a nonvolatile memory connected to core logic controlling the digital trim of the CUT.

\* \* \* \* \*